with raised portions corresponding to the locations of

United States Patent [19]
Melnick et al.

[11] Patent Number: 5,446,314
[45] Date of Patent: Aug. 29, 1995

[54] LOW PROFILE METAL-CERAMIC-METAL PACKAGING

[75] Inventors: Paul J. Melnick, Accord; Anthony J. Mennella, Jr., Saugerties; Herman P. Meyer, Rifton, all of N.Y.

[73] Assignee: International Business Machines Corporation, Armonk, N.Y.

[21] Appl. No.: 157,721

[22] Filed: Jun. 9, 1992

Related U.S. Application Data

[63] Continuation of Ser. No. 574,415, Aug. 28, 1990, abandoned.

[51] Int. Cl.⁶ .................. H01L 23/02; H01L 23/12; H01L 23/16; H01L 23/42
[52] U.S. Cl. .................. 257/678; 257/679; 257/701; 257/703; 257/705; 257/774
[58] Field of Search .................. 357/74, 45, 68, 76, 357/75, 74; 257/678, 679, 701, 703, 705, 774

[56] References Cited

U.S. PATENT DOCUMENTS

| | | | |
|---|---|---|---|
| 2,786,167 | 3/1957 | Esseling | 357/76 |
| 2,791,731 | 5/1957 | Walker et al. | 357/76 |
| 3,231,794 | 1/1966 | Diebold | 357/75 |
| 3,266,125 | 8/1966 | Tobolski | 357/76 |
| 3,388,302 | 6/1968 | McManus | 357/75 |
| 3,476,985 | 11/1969 | Magner et al. | 357/76 |
| 4,021,839 | 5/1977 | Denlinger | 257/701 |
| 4,554,574 | 11/1985 | Wright | 357/76 |
| 4,649,418 | 3/1987 | Uden | 357/74 |

FOREIGN PATENT DOCUMENTS

| | | |
|---|---|---|
| 2319976 | 7/1976 | France . |
| 2395603 | 6/1978 | France . |
| 2551912 | 9/1983 | France . |
| 00883862 | 12/1961 | United Kingdom .............. 257/703 |
| 2135824 | 2/1984 | United Kingdom . |
| 86/01031 | 7/1985 | WIPO . |
| WO8605030 | 2/1986 | WIPO . |

Primary Examiner—Jerome Jackson
Assistant Examiner—Carl Whitehead, Jr.
Attorney, Agent, or Firm—William A. Kinnaman

[57] ABSTRACT

A heat-conductive honeycomb ceramic spacer having an array of apertures for facilitating assembly of a semiconductor device including a plurality of semiconductor stacks using a low-profile contact comprising a foil apertures in the ceramic spacer for forming contacts with the semiconductor stacks when the spacer and the stacks are sandwiched between the foil and another conductive sheet. Use of such a foil also allows disconnection of defective stacks in the device. Extra stacks are provided to compensate for defective stacks, according to an n-x design philosophy. Solder preforms may be included on the stacks and enhanced connections made to the foil of conductive sheet by causing reflux of the solder preforms. The invention may also be applied to multi-layer device constructions.

22 Claims, 3 Drawing Sheets

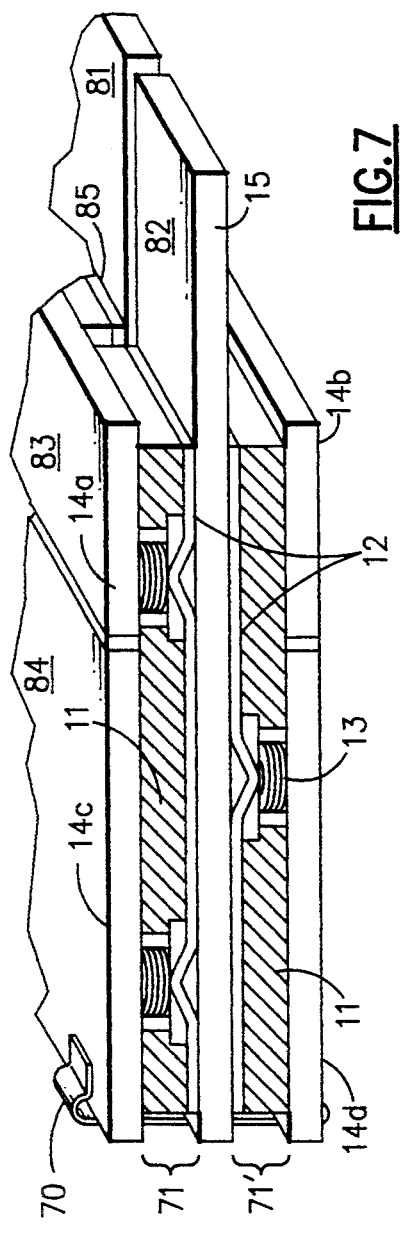
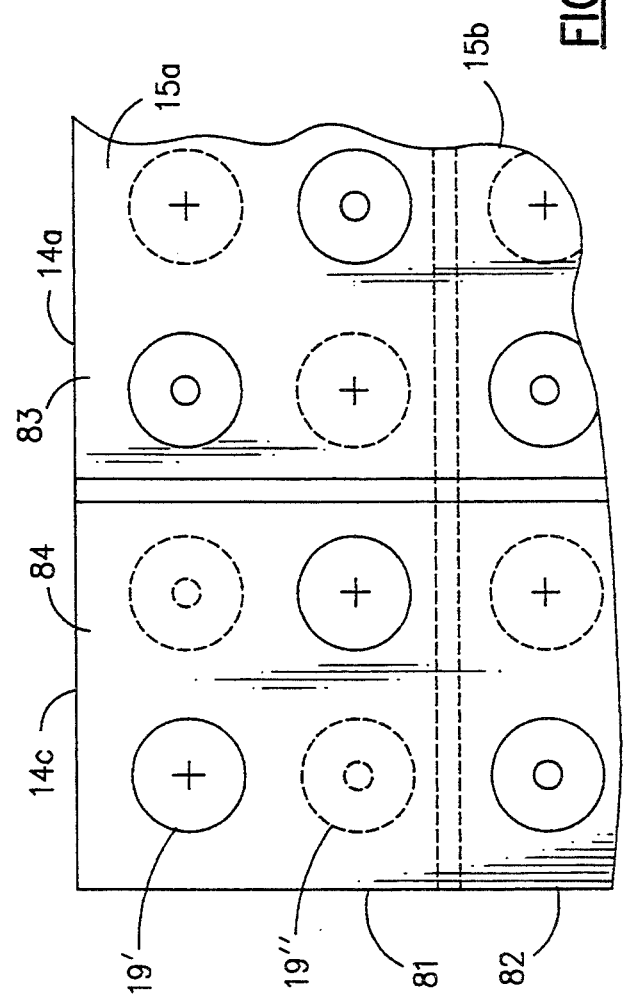

LOW PROFILE METAL-CERAMIC-METAL PACKAGING

CROSS-REFERENCE TO RELATED APPLICATION

This application is a continuation of application Ser. No. 07/574,415, filed Aug. 28, 1990, now abandoned.

BACKGROUND OF THE INVENTION

1. Field of the Invention

This invention generally relates to an apparatus and method for the fabrication of semiconductor devices and more particularly to a structure and method for the construction of multi-chip power semiconductor devices in a low-profile metal-ceramic-metal (LPMCM) package.

2. Description of the Prior Art

The growth of the electronics industry worldwide has caused a need for a great variety of semiconductor products. The packaging of the so-called semiconductor stack (hereinafter, simply "stack", defined as the produced or purchased semiconductor device of whatever desired function may be desired, without connections, protective packaging or heat-sinking structure) to produce finished devices to be used in electronics products has been a matter of great importance in the semiconductor industry. Considerations involved in the choice or design of packaging for the semiconductor device will include the number of stacks which will be required in the device, the number of connections to be applied thereto, the intended apparatus within which the package is to be used, heat dissipation requirements and the like.

It is also the practice, where a power semiconductor device is required, to place a plurality of stacks within a single package for the purpose, on the one hand, of improving device reliability and specifications and, on the other hand, to provide economies in construction of the overall electronics product by minimizing the number of discrete components which must be assembled.

For the semiconductor manufacturer, the question of fabrication yield is also of major concern. First, the stack fabrication process will invariably produce some imperfect or non-functional stacks. The percentage of stacks produced which are functionally acceptable is referred to as the yield. When a plurality of such stacks are included in a single semiconductor device, the yield of the manufactured device may be far less than the yield of the stack fabrication process. This is because the inclusion of only one or a few defective stacks within a device would render the entire device functionally unacceptable. Since the present state of semiconductor technology will generally provide extremely high yields in the stack fabrication process, particularly where the design of the stack is simple and contains relatively few components for relatively low current usage, the problem of reduced device yields has recently been mostly limited to the fabrication of power semiconductor devices where the number of identical, parallel-connected stacks in a single device will be particularly large. However, where chip complexity reduces stack fabrication yields, even a few stacks per device may result in unacceptably low device yields.

To avoid reduced device fabrication yields a so-called (n-x) or (n-1) design philosophy has often been adopted. This means that in a device which contains n stacks of a similar type and similarly connected, x (typically 1) of the provided stacks may be defective within the performance specifications of the device even though such a defective stack or stacks may be required to be functionally disabled or removed from the circuit during fabrication. As an alternative or an addition to the (n-x) design rules, provision may also be made for the replacement of a defective stack within the device. Such an arrangement is shown for a single stack device in IBM Technical Disclosure Bulletin, Vol. 29, No. 3, August 1986, by J. A. Miraglia and J. H. Spreen, pp. 1071–1072.

When stacks of relatively simple design are used in power semiconductor devices, however, the cost of assembling a large number of stacks and other parts tends to increase costs and tending to defeat the potential efficiencies to be obtained in the assembly of a smaller number of devices in a particular product, as indicated above. Therefore, a need exists to simplify the construction of semiconductor devices having a large number of semiconductor stacks included therein.

In addition to the provision of a large plurality of parallel-connected stacks in the same semiconductor device, many special purpose devices require that the semiconductor stacks be accurately arrayed, Such applications include particle detectors, radiation sensors, microwave power receiving antennas and the like. Also, as miniaturization of power devices has increased, the arraying of the stacks has also become important to accommodates the increased criticality of heat dissipation from each respective stack and the heat dissipation and distribution throughout the multi-stack device.

SUMMARY OF THE INVENTION

It is therefore an object of the present invention to provide a structure to facilitate fabrication of a semiconductor device including a plurality of semiconductor stacks.

It is another object of the invention to provide a structure to simplify construction of semiconductor devices including a plurality of semiconductor stacks and disconnection of defective semiconductor stacks.

It is a further object of the invention to provide a structure for providing accurate arraying of semiconductor stacks within a semiconductor device.

It is yet another object of the invention to provide a structure for thermally managing a plurality of semiconductor stacks during operation.

It is a yet further object of the invention to provide a construction method which facilitates the production of a semiconductor device utilizing a large plurality of semiconductor stacks.

It is another further object of the invention to provide a stack array structure of sufficient thermal conductivity that other sources of heat such as parasitic heating from other components electrically or physically connected to the stack array can be cooled by forming a thermal path and heat sinking such other sources of heat through the stack array.

In order to satisfy the above objects, in accordance with one aspect of the invention, a device for providing an array of semiconductor stacks is provided including a ceramic spacer having a predetermined pattern of apertures therein defining the array of stacks and a conductive foil having raised portions thereof coincident with at least some of the apertures of the ceramic spacer.

In accordance with another aspect of the invention, a semiconductor device having an array of semiconductor stacks is provided including a common conductor plate having an area substantially coextensive with at least a portion of said array of stacks, a ceramic spacer having a predetermined pattern of apertures therein defining the array of stacks, a conductive foil having raised portions thereof coincident with at least some of the apertures of the ceramic spacer and a plurality of semiconductor stacks individually positioned within the apertures of the ceramic spacer, wherein the semiconductor stacks and the ceramic spacer are sandwiched between the common conductor plate and the conductive foil.

In accordance with a further aspect of the invention, a method for forming a semiconductor device is provided comprising the steps of positioning individual semiconductor stacks within apertures of a ceramic spacer and sandwiching at least a portion of said ceramic spacer and said semiconductor stacks between a common conductor plate and a conductive foil having raised portions thereof coincident with at least some of the apertures of the ceramic spacer.

BRIEF DESCRIPTION OF THE DRAWINGS

The foregoing and other objects, aspects and advantages will be better understood from the following detailed description of a preferred embodiment of the invention with reference to the drawings, in which:

FIG. 7 is a perspective view of a multi-layer variation of the invention.

FIG. 8 is a partial plan view of the ceramic spacer arrangement of FIG. 7.

DETAILED DESCRIPTION OF A PREFERRED EMBODIMENT OF THE INVENTION

Figure 1:
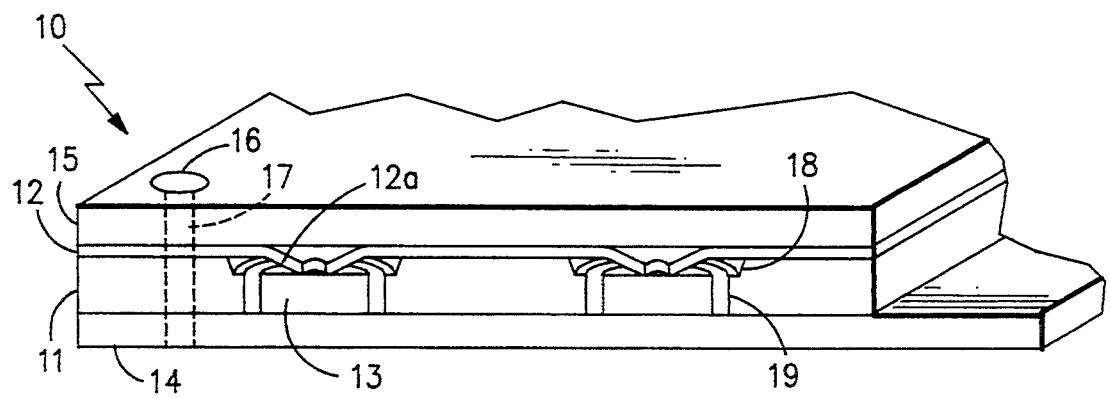
FIG. 1 is a perspective view of a section through a semiconductor structure according to the invention.

Referring now to the drawings, and more particularly to FIG. 1, there is shown a perspective view of a cut-away portion 10 of the invention. In the section, it is seen that the device assembled in accordance with the invention includes a heat-conductive ceramic honeycomb spacer 11 with apertures 19 therein for locating semiconductor stacks 13. The ceramic spacer and the stacks are sandwiched between a formed foil 12 and a common conductor plate 14. a further plate 15, which may be conductive to provide a strong mechanical contact to the foil and for external connections may also be provided. Common conductor plate 14 may have an extension, as shown, to provide for a similar mechanically strong connection to the device. A hole 17 and a compression fastener may also be provided to assure a mechanically prestressed construction of the device. Alternatively, surface 11a of the ceramic spacer can be formed with a rough texture or roughened after forming to provide a good surface for compression bonding of the layers of the device with, for instance, epoxy or a reflowed solder paste. The invention structure is therefore suitable to both hermetic sealing and compression sealing.

Figure 2:
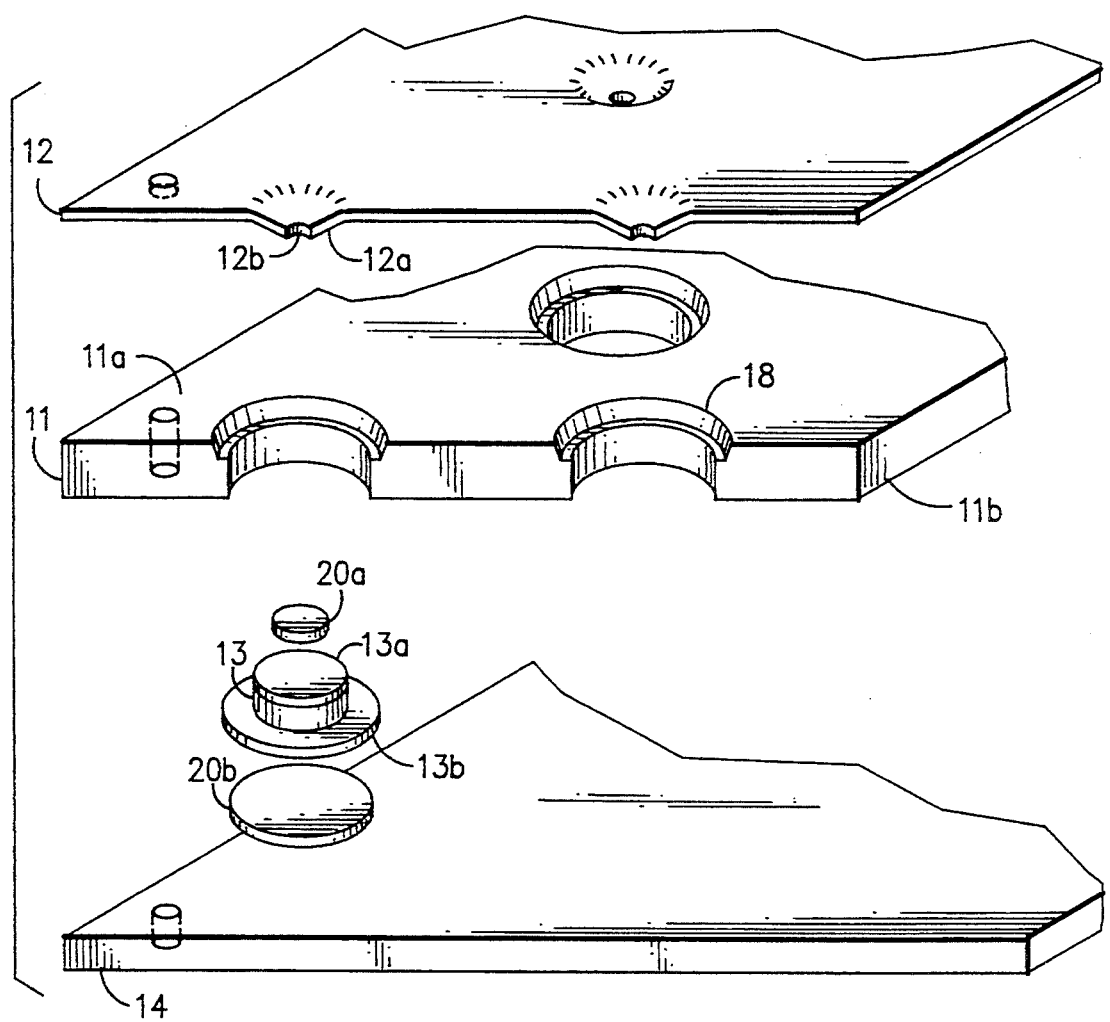
FIG. 2 is an exploded view of the structure of FIG. 1, with some parts omitted for clarity.

As shown more clearly in FIG. 2, the formed foil member 12 is fabricated with dimples or other suitably formed raised portions 12a in a pattern corresponding to the pattern of apertures in the ceramic spacer. These raised portions 12a will also preferably be formed with small holes 12b in order to release gas pressure during fabrication of the device and to provide greater bonding area if connections to the stack are to be enhanced by the use of solder preforms, as will be discussed below. The foil is preferably of copper and should be of a thickness which is sufficient for the raised dimples to retain their shape and exert a substantial spring force against the stack within the aperture which, in turn urges the stack against the common conductor plate 14. The shape of the dimples in the foil also provide thermal stress relief. The foil may also be plated, if desired with silver, gold or the like to enhance the connection and reduce contact resistance.

As further shown in FIG. 2, the stack, itself may include one or more contact structures 13a and 13b of a material such as Molybdenum. Alternatively, as shown in FIG. 1, the stack may be simply a silicon slug which has a desired semiconductor structure formed therein. The stack may also have one or more solder preforms 20a and 20b which may be separate, as illustrated, or formed on the stack. Since the semiconductor stack according to the invention may be subjected to relatively high temperatures and thermal cycling, either of which may reduce the spring-like function of the raised portions, it is deemed desirable to use such solder preforms and to cause them to be reflowed during assembly of the device to provide a mechanically secure contact of low resistivity which is substantially less subject to thermal aging than the spring contact of the foil alone.

As can also be seen in the exploded view of FIG. 2, the apertures in the ceramic spacer are arranged in a predetermined pattern which will assist in the thermal management of the device as will be further discussed below. The apertures themselves also have a groove 18 which assists in the further working of the foil during disconnection of defective devices as will now be described in connection with FIGS. 3A and 3B.

Figure 3A:
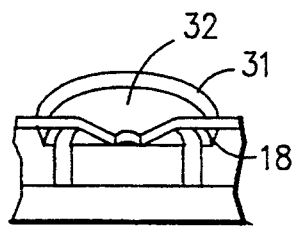
FIGS. 3A and 3B are views of a portion of the structure of FIG. 1, showing a preferred technique of disconnection of defective stacks.
Figure 3B:
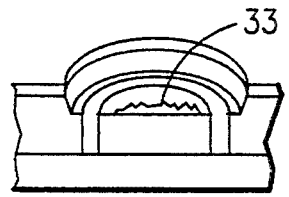

In FIG. 3A, it is assumed that after assembly, the device is tested and the illustrated stack is found to be defective. Defects are typically of the form where the stack is either shorted or open-circuited. Such defects are easily located by the application of current in both directions across the device and the defective stack located by a distinct thermal response. The use of a thermally sensitive material, such as liquid crystal, will allow detection of the defective stack by inspection in a manner well-known in the art. The technique of defective stack detection, itself, is therefore not considered to form a part of the present invention.

Once a defective stack has been located, it can be disconnected from the device by forming a cut 31 with a suitable cutter such as a die or even manually. In either case, groove 18 provides assistance as a guide and enhances a clean cut against the edge of the ceramic spacer surface. Due to the spring-like performance of the raised dimple in the foil, after the cut is made, the cut portion 32 will be raised above the surface of foil layer 12 and can be easily removed by suitable mechanical means or even manually, leaving only residue 33 of the solder preform, if used.

Figure 4:
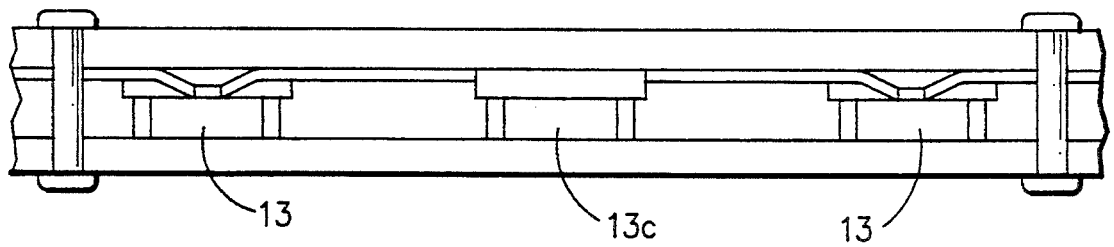
FIG. 4 is a sectional view of the invention.

FIG. 4 is a sectional view of the finished device similar to FIG. 1. In this case, stack 13c having been found defective and the foil cutting and removal operations described above having been done, no raised portion of the foil structure appears in the centrally illustrated aperture of the device. It is possible to leave the raised portion of the foil in place after cutting but this is not preferred since, unless material is removed to form a kerr (e.g. performing the cut by sawing), the distance between foil portions will be small and made smaller by compression of the device connection could then be possibly reestablished by solder reflux or mechanical deformation of the raised portion of the foil.

Figure 5:
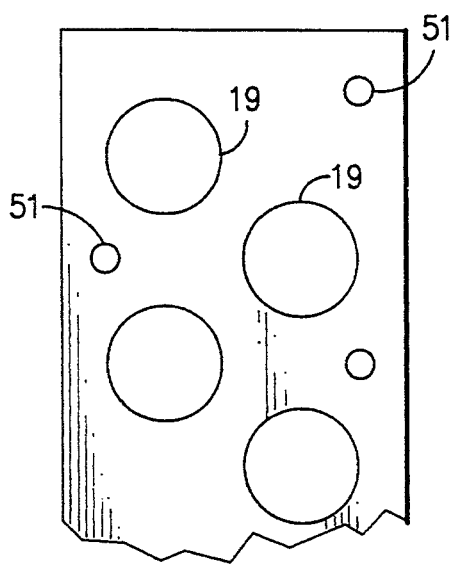
FIG. 5 and FIG. 6 are plan views of two embodiments of the ceramic spacer.
Figure 6:
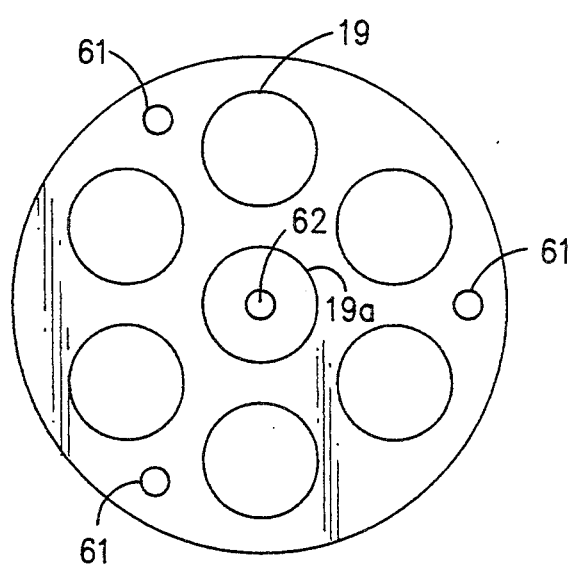

The construction discussed above can be implemented with equal ease for any desired array of stacks. For example, FIG. 5 shows a rectangular configuration and FIG. 6 shows a circular configuration. Stack locations are indicated at 19 of both Figures. If desired, holes for compression devices 51, 61 can also be formed in the spacer either before or during assembly to provide a relatively even compression force to enhance heat transfer. However, it may be advantageous in the circular arrangement of FIG. 6 to omit the central stack 19a and to apply compression only at location 62. Separation of stack locations 19 is a matter of thermal design and well within the level of one skilled in the art in view of the present disclosure. The heat flow, in accordance with the invention, takes cognizance of the fact that the heat flow within the stacks takes places toward both the anode and cathode of each stack. The heat flow may also be influenced by the orientation of the stack and the device containing the stack. When cooling of the device can take place from both sides of the device, the thermal conductivity of the ceramic is of less importance in comparison to the heat conductivity of the metal foil or common electrode, which will rapidly assume a relatively isothermal condition and from which heat can be readily removed. Therefore, in such a case, it is not necessary that the heat conductive ceramic spacer be directly in the thermal path for cooling of the stack anodes or cathodes.

However, when heat can only be removed from one side of the device due to physical requirements such as combination with other electrical structures or, more particularly, a second embodiment of the invention to be described in detail below and with reference to FIG. 7, the ceramic provides a thermal path for heat from the uncooled side of the array to the cooled side of the array.

The thermal design of the device according to the invention is also for the purpose of maintaining all stacks at approximately the same temperature since the conduction properties of semiconductors changes significantly with temperature although this temperature equalization is also largely a function of the copper or other metal in the conductors. Therefore, temperature equalization can usually be adequately achieved by fairly regular spacing and assuring that the area of the apertures does not exceed the remaining area of the ceramic. The ratio of aperture area to the remaining area of the ceramic spacer should preferably be adjusted in consideration of the thermal conductivity of the ceramic, the thickness of the spacer and any asymmetry of heat dissipation in the stacks.

The preferred material for the ceramic spacer is alumina which is electrically insulative, exhibits good thermal conductivity and is relatively inexpensive. Other more expensive materials with a much higher thermal conductivity, such as aluminum nitride, are also usable with the invention and are preferred for some implementations of the invention. Consider an implementation of the invention where the stack array was formed with another electrical device such as a transformer or another stack array as in the embodiment of FIG. 7, which is also a source of heat transferred to the device through common bus 15. If cooling for the combination device could only be provided at common electrode 14, the use of a ceramic of higher thermal conductivity, such as aluminum nitride, mentioned above, would allow formation of a thermal path including, in sequence, the heat source, the ceramic spacer of the device and a heat sink, thereby permitting heat sinking of that heat source through the stack array.

FIG. 7 shows a variation of the device constructed in accordance with the invention. In this embodiment, the device is symmetrically constructed as a multi-layer device. As illustrated, a conductive compression plate 15 is used as a central common anode contact while common conductor plates 14 are arranged on the outside of the device. This configuration could be reversed with common conductor plate 14 forming the central cathode connection. However, the configuration shown is deemed preferable to improve heat dissipation from the stacks. Since the central member is conductive, insulators must be provided around compression members such as 16 in FIG. 1, if used. Alternatively, a cliplike compression device 70 could be used. In either case, the compression device can also be used to provide a connection between the outside conductors.

It should be noted with regard to the embodiments of both FIG. 1 and FIG. 7 that the common conductor 14 can also be formed as a foil with raised portions and that the stacks can be oriented in either direction as long as the direction remains consistent among the stacks which are connected in parallel. However, heat path characteristics of the stacks may require some asymmetry of design. It should also be noted that conductors 12, 14 and 15 need not be unitary and any or all of them may be applied to the device as a plurality of strips 83, 84 or other geometrical configurations, as may be desired or found to be advantageous. Some of the strips can also be used as control electrodes, allowing the invention to be readily applied to transistors, Silicon Controlled Rectifiers, thyristors and other devices as well as diode stacks, either throughout the device or in combination, such as by inclusion of a series voltage regulator with power rectifiers. If necessary to provide proper electrical connections, additional thermally conductive insulators can be provided as layers in the device such as at location 85 between conductor 15 and foil 12. Either or both of conductor 15 and foil 12 can be patterned as may be desired to form the required connections. Finally, the staggered locations of the stacks in the layers of the embodiment of FIG. 7 allows good thermal management in a particularly compact form of the overall device.

FIG. 8 shows a plan view of this staggering of stack locations; the solid circles 19' indicating stack locations in one layer and the dashed circles 19" indicating stack locations in the other layer. To form a single high power rectifier, the relative orientations of the stacks is shown by the + and ○ designations in any one of the four quadrants illustrated. In this regard, the construction according to the invention can also be used to form a circuit of several devices, each comprising a plurality of stacks, within the same device. As illustrated in FIG.

8, if the conductors are suitably divided at 81, 82, 83 and 84 and the polarities of the stacks correspondingly reversed, a bridge rectifier can easily be fabricated. In this case, the relative orientations of the stacks would be as illustrated in the four adjacent quadrants of FIG. 8. Conductors 15a and 15b are provided to connect two stack groups in each layer, respectively, and divided common electrodes 14a, 14b and 14c, 14d are respectively connected in a manner such as conductor 70. Of course, a much greater number of stacks in each quadrant could be used, as required to provide a device of the desired specifications, which the present invention makes economically and technically feasible. Other structures and circuit configurations are similarly possible.

The structure of the present invention may be fabricated by placing or otherwise affixing (e.g. with an insulative adhesive) the stacks either within the honeycomb spacer or on the common conductor and then assembling the spacer and the common conductor. The assembly order is not critical to the invention and several different orders of assembly can be implemented. The foil member is then located on the spacer and the assembly is compressed at approximately 100 psi to form a gas-tight seal and all parts other than compression plate 15 are either bonded or fastened. Reflux of the solder preforms is also done at this time and the entire assembly and bonding process can be accomplished in a single pass.

At this point, the device is sufficiently complete for burn-in and testing. Defective stacks are located and removal from the circuit is done as discussed above. Then the compression plate is bonded or fastened into place, external connections made, for instance, by a lead frame and/or welding and final encapsulation is performed.

In view of the above, a structure has been provided which provides for economical assembly and good thermal management in a device having a plurality of semiconductor stacks and which may be conveniently implemented in a variety of forms to produce unitary devices or circuits having high performance at a high manufacturing yield.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. A device for providing an array of semiconductor stacks including
   a ceramic spacer having first and second opposing sides and having a predetermined pattern of apertures therein defining said array of stacks, said apertures having a first aperture portion on said first side of said spacer with a first aperture cross sectional area for receiving a semiconductor stack and a second aperture portion, coaxial and adjacent to said first aperture portion on said second side of said spacer, with a larger cross sectional area than said first aperture portion, and
   a resilient conductive foil disposed on said second side of said spacer, said foil having raised portions thereof extending into at least some of said apertures of said ceramic spacer.

2. A device as recited in claim 1, further including
   a common conductor plate having an area substantially coextensive with at least a portion of said array of said semiconductor stacks.

3. A device as recited in claim 1, wherein said apertures define locations for individual ones of said semiconductor stacks.

4. A device as recited in claim 2, wherein said apertures define locations for individual ones of said semiconductor stacks.

5. A device as recited in claim 3, further including
   a plurality of said semiconductor stacks individually positioned within said apertures of said ceramic spacer.

6. A device as recited in claim 4, further including
   a plurality of said semiconductor stacks individually positioned within said apertures of said ceramic spacer.

7. A device as recited in claim 6, wherein said semiconductor stacks and said ceramic spacer are sandwiched between said common conductor plate and said conductive foil, said raised portions of said conductive foil pressing corresponding ones of said semiconductor stacks into contact with said common conductor plate.

8. A device as recited in claim 7, wherein at least one of said common conductor plate and said conductive foil is bonded to said ceramic spacer.

9. A device as recited in claim 7, wherein at least one of said semiconductor stacks includes at least one solder preform.

10. A device as recited in claim 9, in which said solder preform forms a connection between said semiconductor stack and at least one of said common conductor plate and said conductive foil.

11. A semiconductor device having an array of semiconductor stacks including
    a common conductor plate having an area substantially coextensive with at least a portion of said array of said stacks,
    a ceramic spacer having first and second opposing sides and having a predetermined pattern of apertures therein defining said array of stacks, said apertures having a first aperture portion on said first side of said spacer with a first aperture cross sectional area for receiving a semiconductor stack, said plate being disposed on said first side of said spacer, and a second aperture portion, coaxial and adjacent to said first aperture portion on said second side of said spacer, with a larger cross sectional area than said first aperture portion,
    a resilient conductive foil disposed on said second side of said spacer, said foil having raised portions thereof extending into at least some of said apertures of said ceramic spacer, and
    a plurality of semiconductor stacks individually positioned within said apertures of said ceramic spacer in electrical contact with said plate and said raised portions of said foil.

12. A semiconductor device as recited in claim 11, wherein said common conductor plate comprises a conductive foil having raised portions thereof coincident with at least some of said apertures of said ceramic spacer.

13. A semiconductor device as recited in claim 11, wherein at least one of said semiconductor stacks includes at least one solder preform.

14. A semiconductor device as recited in claim 11, further including at least one further ceramic spacer having a predetermined pattern of apertures therein defining said array of stacks, at least one further conductive foil having raised portions thereof coincident with at least some of said apertures of said ceramic spacer, and a plurality of semiconductor stacks individually positioned within said apertures of said at least one further ceramic spacer.

15. A semiconductor device as recited in claim 14, further including at least one further common conductor plate having an area substantially coextensive with at least a portion of said array of said stacks.

16. A semiconductor device as recited in claim 15, further including at least one electrical connection between selected ones of said conductive foil, said further conductive foil, said common conductive plate and said further common conductive plate.

17. A device as recited in claim 11, wherein at least one of said semiconductor stacks includes at least one solder preform means for forming a connection between said semiconductor stack and at least one of said common conductor plate and said conductive foil.

18. A device as recited in claim 16, wherein at least one of said semiconductor stacks includes at least one solder preform means for forming a connection between said semiconductor stack and at least one of said common conductor plate and said conductive foil.

19. A device as recited in claim 1 in which said raised portions are perforated.

20. A device as recited in claim 11 in which said raised portions are perforated.

21. A device for providing an array of semiconductor stacks including a ceramic spacer having opposing sides and having a predetermined pattern of apertures therein defining said array of stacks, and a resilient conductive foil disposed on one of said opposing sides of said spacer, said foil having raised portions thereof formed with perforations and extending into at least some of said apertures of said ceramic spacer.

22. A semiconductor device having an array of semiconductor stacks including a common conductor plate having an area substantially coextensive with at least a portion of said array of said stacks, a ceramic spacer having first and second opposing sides and having a predetermined pattern of apertures therein defining said array of stacks, said plate being disposed on said first side of said spacer, a resilient conductive foil disposed on said second side of said spacer, said foil having raised portions thereof formed with perforations and extending into at least some of said apertures of said ceramic spacer, and a plurality of semiconductor stacks individually positioned within said apertures of said ceramic spacer in electrical contact with said plate and said raised portions of said foil.

* * * * *